US010073476B2

United States Patent
Rogledi

(10) Patent No.: US 10,073,476 B2
(45) Date of Patent: Sep. 11, 2018

(54) MILLER COMPENSATION CIRCUIT, AND CORRESPONDING REGULATOR, SYSTEM, AND METHOD

(71) Applicant: STMICROELECTRONICS S.R.L., Agrate Brianza (IT)

(72) Inventor: Nicola Rogledi, Pavia (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 10 days.

(21) Appl. No.: 15/454,840

(22) Filed: Mar. 9, 2017

(65) Prior Publication Data
US 2018/0059698 A1    Mar. 1, 2018

(30) Foreign Application Priority Data

Aug. 31, 2016  (IT) ................. 102016000088370

(51) Int. Cl.
G05F 1/575  (2006.01)
H03F 3/45  (2006.01)

(52) U.S. Cl.
CPC ......... G05F 1/575 (2013.01); H03F 3/45475 (2013.01)

(58) Field of Classification Search
CPC . G05F 1/575; G05F 1/56; G05F 1/565; H03F 3/45475; H02M 3/156; H02M 3/158
USPC ................................. 323/273–280
See application file for complete search history.

(56) References Cited

U.S. PATENT DOCUMENTS

| 9,893,689 B2 * | 2/2018 | Pasotti ............... H03F 3/45273 |
| 2002/0171487 A1 | 11/2002 | Sidiropoulos et al. |
| 2006/0192538 A1 * | 8/2006 | Wang .................. G05F 1/575 323/282 |
| 2006/0197513 A1 * | 9/2006 | Tang .................... G05F 1/575 323/273 |
| 2007/0096825 A1 | 5/2007 | Okuyama |
| 2008/0001592 A1 * | 1/2008 | Conte .................. G05F 1/46 323/316 |
| 2010/0148875 A1 * | 6/2010 | Augustyniak .......... H03F 1/086 330/291 |
| 2011/0187456 A1 * | 8/2011 | Huang .................. H03F 3/45 330/192 |

(Continued)

OTHER PUBLICATIONS

Received STIC search report from EIC 2800 searcher Samir Patel on Jul. 21, 2017.*

(Continued)

*Primary Examiner* — Timothy J Dole
*Assistant Examiner* — Htet Z Kyaw
(74) *Attorney, Agent, or Firm* — Seed IP Law Group LLP

(57) ABSTRACT

A circuit with Miller compensation effect includes a first stage and a second stage, with a first terminal for receiving a bias current and a second terminal that can be coupled to ground, wherein the first stage includes a differential stage coupled via a coupling line to the second stage. The second stage includes a transistor with a Miller compensation network, which is set between the first terminal of the second stage and the control terminal of the aforesaid transistor. A compensation-control transistor, which is coupled to the second terminal of said differential stage, can be activated for coupling the aforesaid second terminal to ground, the compensation-control transistor having its control terminal coupled to the aforesaid coupling line between the first and second stages.

20 Claims, 2 Drawing Sheets

(56) References Cited

U.S. PATENT DOCUMENTS

| | | | | |
|---|---|---|---|---|
| 2012/0182075 A1* | 7/2012 | Ivanov | ............... | H03F 1/086 330/310 |
| 2012/0286871 A1* | 11/2012 | Ohnuki | ............ | H03F 1/0277 330/261 |
| 2013/0024032 A1* | 1/2013 | Vukojevic | ......... | H02J 3/1828 700/291 |
| 2014/0043100 A1* | 2/2014 | Zabroda | ............... | H03F 1/14 330/277 |
| 2014/0327313 A1* | 11/2014 | Arditi | ........... | H01L 31/02021 307/63 |
| 2017/0169870 A1* | 6/2017 | Dray | ............. | G11C 11/1673 |

OTHER PUBLICATIONS

Ferrari et al., "Transimpedance Amplifier for High Sensitivity Current Measurements on Nanodevices," *IEEE Journal of Solid-State Circuits* 44(5):1609-1616, 2009.

Singh et al., "A Hardware optimized Low power RNM Compensated three stage Operational amplifier with Embedded Capacitance Multiplier Compensation," *2016 International Conference on VLSI Systems, Architectures, Technology and Applications (VLSI-SATA)*, 2016, 6 pages.

* cited by examiner

MILLER COMPENSATION CIRCUIT, AND CORRESPONDING REGULATOR, SYSTEM, AND METHOD

BACKGROUND

Technical Field

The present description relates to Miller compensation circuits.

One or more embodiments may regard Miller compensation circuits that can be used, for example, as gain stages in linear regulators and tracker regulators or, more in general, in circuits where a compensation via a capacitance straddling an amplifier is desired.

Description of the Related Art

In electronics, the Miller effect identifies the phenomenon that may arise in feedback systems in which the feedback impedance comprises a capacitance, for example, a capacitor connected across the input and the output of an amplifier.

This may be the case of a network with a capacitor connected between the control terminal (e.g., the gate in the case of a field-effect transistor or the base in the case of a bipolar transistor) and the drain/collector of a transistor.

The value of the above capacitor is seen:
from the input, as being connected in parallel to the input itself and multiplied by a factor $(1-A_v)$, where $A_v$ is the voltage gain of the amplifier; and
from the output, as being connected in parallel to the output itself and multiplied by a factor $(A_v-1)/A_v$.

The Miller amplifier can be used as gain stage, for example, in linear regulators and tracker regulators and also in other circuits where a compensation via a capacitance straddling an amplifier is desired.

In the case of linear regulators and tracker regulators, it is useful to be able to have available a good capacity of reaction to variations in the load and in the supply. For example, good performance in terms of speed of reaction to these stimuli is a desirable characteristic in applications, such as applications in the automotive sector, for example in engine-control functions.

The above regulators can be used as supply circuits (for example, voltage supplies) for microprocessors, so that high levels of precision (for example, in terms of offset), rejection of disturbance, for example of the battery (line regulation), as well as speed of response to variations in the load (load regulation) are desirable.

A characteristic that is at times difficult to achieve in the above regulators is the rejection in regard to variations of the battery level linked to events of the crank type (supply of the starter motor of a motor vehicle), these events possibly inducing a reduction in the battery level down to very low values, which are liable to send the regulator itself into an LDO (Low Drop-Out) mode, in unbalanced conditions and with the output stage operating in triode mode.

At exit from a crank event, the battery value can return to the nominal value in rather short times, with a rather sharp rise in the battery level. It is desirable, in these conditions, for the regulator to be able to return rapidly into the regulation function, preventing the battery from sending the output voltage of the regulator to high values through the output stage that is completely on. Such a possibility may lead to serious damage to the load, for example in the case where this is a microprocessor.

BRIEF SUMMARY

One or more embodiments overcome the drawbacks outlined above and, more in general, contribute to further improvements in Miller compensation circuits.

One or more embodiments are directed to a circuit that includes:

a first stage including a first terminal configured to receive a first bias current and a second terminal coupleable to ground, wherein said first stage includes a differential stage;

a second stage that includes a first terminal configured to receive a second bias current, a second terminal coupleable to ground, a first transistor with a control terminal, and a Miller compensation network coupled between the first terminal of the second stage and the control terminal of said first transistor;

a coupling line that couples the differential stage to the second stage; and a second transistor coupled to the second terminal of said first stage and configured to couple to ground said second terminal of said first stage, said second transistor having a control terminal coupled to said coupling line between said first stage and said second stage.

One or more embodiments may also regard a corresponding regulator, as well as a corresponding system and a corresponding method.

The claims form an integral part of the technical teaching provided herein in relation to one or more embodiments.

One or more embodiments facilitate regulation of complete turning-off for example of the transistor used as Miller amplifier.

For instance, in the case of a tracker regulator, one or more embodiments enable the internal node of the stage of the error amplifier to be kept at limited values.

One or more embodiments enable the Miller capacitance not to be discharged completely, thus reducing the time of delay of the regulator at exit from the crank phase.

BRIEF DESCRIPTION OF THE SEVERAL VIEWS OF THE FIGURES

One or more embodiments will now be described, purely by way of non-limiting example, with reference to the annexed drawings, in which.

DETAILED DESCRIPTION

In the ensuing description, various specific details are illustrated, aimed at enabling an in-depth understanding of various examples of embodiments. The embodiments may be obtained without one or more of the specific details, or with other methods, components, materials, etc. In other cases, known structures, materials, or operations are not illustrated or described in detail so that the various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like that may appear in various points of the present description do not necessarily refer exactly to one and the same embodiment. Moreover, particular conformations, structures, or characteristics may be combined in any adequate way in one or more embodiments.

The references used herein are provided merely for convenience and hence do not define the sphere of protection or the scope of the embodiments.

Figure 1:
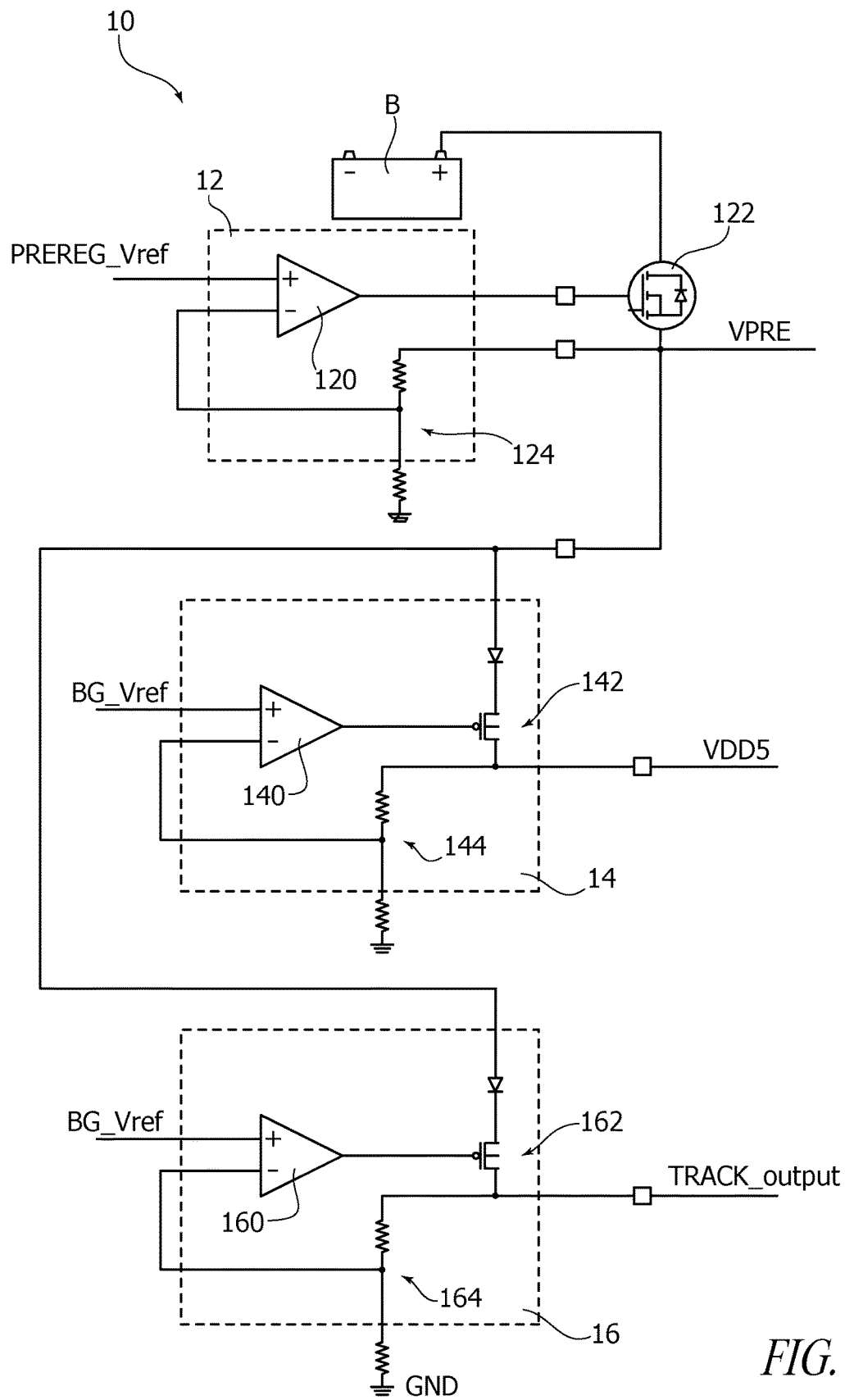
FIG. 1 is a general block diagram of a power-supply system, for example for application in the automotive sector.

In FIG. 1 the reference number 10 designates as a whole a voltage-regulator system that can be coupled, for example, to a battery B of a motor vehicle (not visible in the figures).

In one or more embodiments, the system 10 may comprise a number of cascaded stages or units, such as a pre-regulator 12 and one or more linear regulators 14, 16.

Of course, reference to one pre-regulator 12 and to two linear regulators 14, 16 is not to be understood as in any way limiting the scope of the embodiments: the number of stages comprised in the system 10 may, in fact, be any whatsoever.

In one or more embodiments, as exemplified herein, the pre-regulator 12 can be coupled to an active component such as a MOS transistor 122 that is able to supply, starting from the voltage of the battery B, a voltage VPRE. For example, in order to reduce power dissipation of the system, the voltage VPRE may be pre-regulated to an intermediate value, for example, between the value of the battery voltage and the output level of the one or more cascaded regulators, such as the regulators 14 and 16 represented in FIG. 1.

In one or more embodiments, the cascaded regulator or regulators (i.e., the regulators 14, 16 in the example presented herein) may have the task of supplying two voltages, such as the voltages VDD5 and the voltage TRACK_output, having characteristics of stability both from the static standpoint and from the dynamic standpoint.

In one or more embodiments, the pre-regulator 12 and the regulator or regulators 14, 16 may present a general architecture that is as a whole similar.

For example, in one or more embodiments, these stages may comprise an operational amplifier 120, 140, 160, which is able to receive on a first input (for example, the non-inverting input) a reference voltage PREREG_Vref, BG_Vref (the latter possibly being the same for both of the regulators 14, 16) and to drive via its output a power component, for example an active component such as a MOSFET (for example, precisely the component 122) or, in the case of the regulators 14 and 16, MOSFETs 142 and 162.

In one or more embodiments, the various stages 12, 14, 16 of the system 10 may comprise a feedback network 124, 144, 164, schematically exemplified in FIG. 1 by a voltage divider, which is able to perform a feedback action from the output to the other input (for example, the inverting input) of the respective operational amplifier 120, 140, 160.

The general architecture of the system 10 exemplified in FIG. 1 must on the other hand be considered in itself known, this rendering a more detailed description herein superfluous.

In one or more embodiments, the various regulators exemplified in FIG. 1 may comprise an LDO (Low Drop-Out) function, which makes it possible for them to supply current at the respective outputs with a reduced supply voltage (VPRE). In one or more embodiments, the above regulators may be able to detect a battery condition (low) and to switch on the respective power output transistors completely. This operating mode may prove advantageous, for example, in a so-called crank phase (as is described in the introductory part of the present description) and/or in a microcut phase (instantaneous drop in the supply voltage) or, more in general, upon onset of events such as might cause the voltage of the battery B to drop drastically (even below 5 V).

As already mentioned previously, exit from or re-entry into such a condition (for example, the crank condition or the microcut condition) may be followed by a very fast increase in the battery voltage up to rather high levels. Such a condition may prove dangerous, and it is desirable for the regulators, as they come to be in an LDO condition, to be able to restore the linear operating conditions before the battery transient has terminated so as to prevent an extra-voltage of a non-acceptable level on their output voltages (with possible negative effects on the load supplied by them).

Various specifications that regulate creation of systems such as the one exemplified in FIG. 1 may require linear regulators to present a controlled management of their output voltage.

For example, the voltage of the regulator may be desired to be contained within 5.2 V in the case where, during the transient, the supply voltage of the pre-regulator 12 (for example, the voltage of the battery B) passes from 5.1 V to 13.5 V in 10 µs (i.e., with a variation of 0.84 V/p).

With reference to FIG. 1 it may be noted that a battery voltage of, for example, 5.1 V applied, for example, on the drain of a MOS transistor constituting the active component 122, may correspond to a pre-regulated voltage VPRE of 5.1 V, this voltage being used for supplying the linear regulators 14 and 16 downstream, which are to supply the voltages VDD5 and TRACK_output.

As already mentioned, linear regulators such as the ones exemplified in FIG. 1 may be used, for example, for supplying an external sensor device in the automotive sector. In this case, it is desirable for it to be possible to supply or "copy" a certain voltage with high precision with the added possibility of providing a protection against short circuits towards ground (GND) and towards the battery.

In one or more embodiments, it is desirable for the linear regulator to be able to supply an external sensor with a supply voltage Vsupply of a reduced value, it being for example able to work with a resistance Rdson (drain-to-source resistance with the FET in the ON state), i.e., in LDO conditions when the voltage Vsupply drops to values close to the sensor voltage.

This condition may, for example, arise at a crank event of the type described previously, i.e., when the electric starter motor for starting the engine of a motor vehicle is driven in rotation absorbing a high current from the battery and reducing the level thereof.

In one or more embodiments, the above crank phase may lead to a drop in the battery voltage down to 4-5 V, causing the output voltage of the regulator to be excessively low in the case where the regulator is not provided with an LDO circuit. During resumption from the crank phase (i.e., when the supply returns rapidly to its original value) it is desirable for the intervention of the error amplifier not to be delayed following upon phenomena of saturation of the internal node so as to be able to prevent the output voltage from being "pulled up" by the supply voltage. In other words, it is desirable for the regulator to show a good degree of rapidity in recovery from the LDO operating mode so as to prevent overshoot phenomena.

Figure 2:
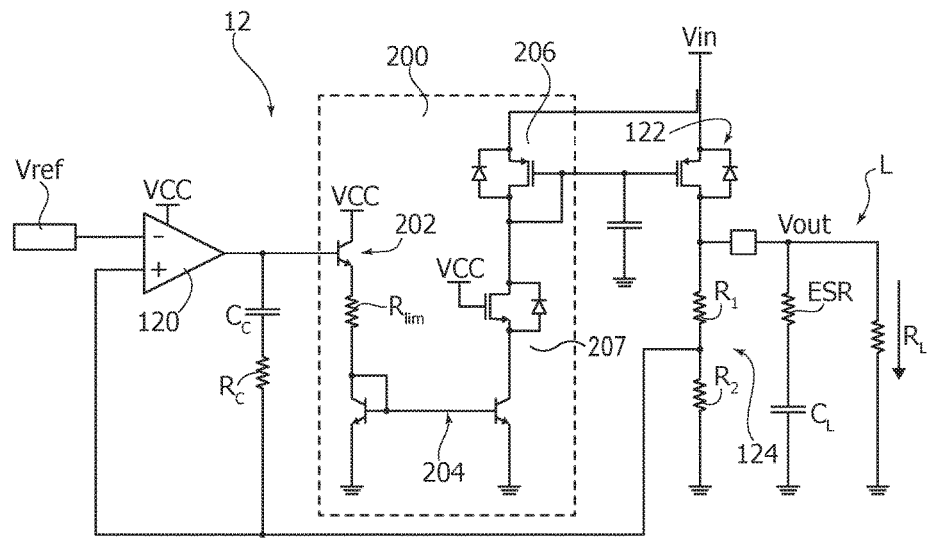
FIG. 2 is a more detailed circuit diagram of a circuit that can be included in the system of FIG. 1.

The diagram of FIG. 2 exemplifies a possible regulator-circuit architecture.

By way of example, the diagram of FIG. 2 includes the pre-regulator 12, so that parts or elements already described in relation to FIG. 1 are identified in FIG. 2 by the same references, which renders any repetition of the corresponding description superfluous.

The diagram of FIG. 2 exemplifies the possibility, for the differential stage 120 (which may comprise a so-called operational transconductance amplifier—OTA), of receiving on one of its inputs (for example, an inverting input) a reference voltage Vref and of driving, through a level-shifter stage 200, the active "power" component 122, here exemplified in the form of a MOS transistor.

The component 122 in turn drives the load L, supplying thereto a regulated output voltage, here designated by Vout, that can be fed back to the input of the operational amplifier 120 through a voltage divider $R_1$, $R_2$, which can be seen as corresponding to the feedback network designated by 124 in the diagram of FIG. 1.

The circuit diagram of FIG. 2 also exemplifies the possible presence of a network $R_cC_c$ at output from the operational amplifier 120 as well as the presence of a load L (for example, a sensor) here represented in general terms in the form of a circuit comprising, for example, a resistor $R_L$ connected in parallel to a capacitor $C_L$ of which the equivalent series resistor ESR is moreover represented. Of course, this exemplification is provided merely by way of example and is not to be understood as in any way limiting the embodiments, it being notable on the other hand that the load L in general constitutes a distinct element that does not form part of the regulator shown in FIG. 2.

In one or more embodiments, as exemplified in FIG. 2, the level-shifter stage 200 may comprise an input transistor 202 (and a resistor $R_{lim}$ that provides a limitation of the maximum current obtained on the corresponding branch), such as a bipolar transistor that receives on its base the output of the operational amplifier 120 and drives, basically as biasing stage, a current-mirror circuit 204.

The circuit 204 drives an active component 206 (such as a MOS transistor), which is in turn coupled, according to a general current-mirror scheme, to the active output component 122. Between the current mirror circuit 204 and the active component 206 is a bias transistor 207.

One or more embodiments may propose solutions for improving the response of the operational amplifier 120 during the unbalancing step.

One or more embodiments may apply to amplifiers of an OTA (operational transconductance amplifier) type used as error amplifiers, for example in regulators of the type exemplified herein.

Figure 3:
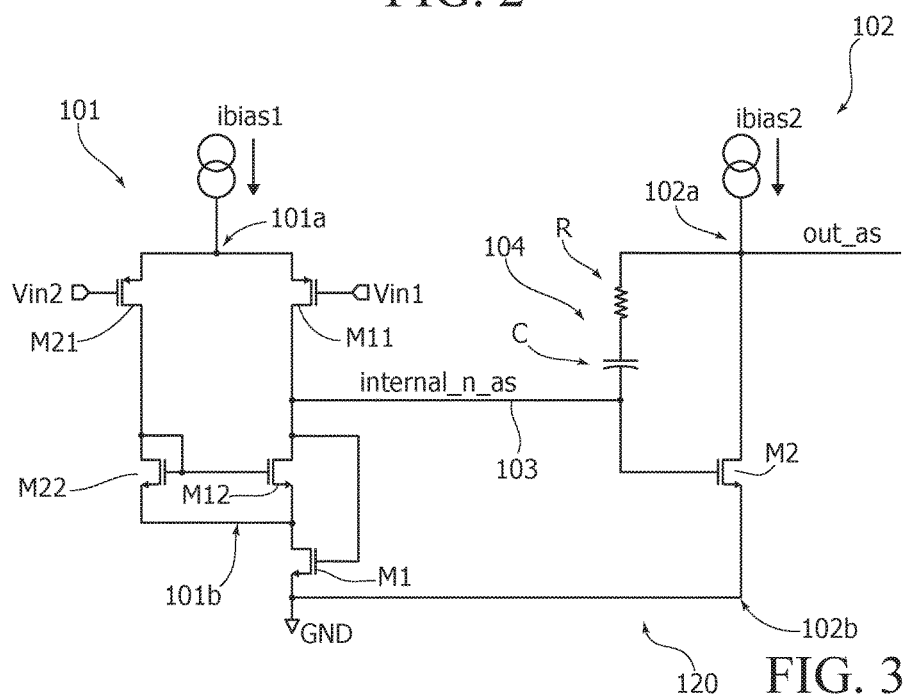
FIG. 3 is a more detailed circuit diagram of an amplifier of FIG. 2.

One or more embodiments may apply to OTA architectures corresponding to the general solution exemplified in FIG. 3, which is to be considered in itself conventional in its general terms.

In this architecture, there may in general be distinguished a first stage 101 and a second stage 102, each having a respective first terminal 101a, 102a configured to receive a respective bias current (ibias1, ibias2).

In the case of the second stage 102, the first terminal 102a can function as output terminal (signal out_as) of the differential amplifier.

The stages 101, 102 then have respective second terminals 101b and 102b, which can be electrically coupled to ground GND according to the criteria described more fully in what follows.

In one or more embodiments, the first stage 101 of FIG. 3 comprises a differential stage coupled to the other stage (in the present case, to the stage 102) through a coupling line 103 (signal internal_n_as).

In one or more embodiments, the second stage 102 may comprise a transistor (e.g., a field-effect transistor) designated by M2 with a Miller compensation network 104 that may include, in addition to a Miller capacitor C, a resistor R.

In one or more embodiments, the Miller compensation network may be set "straddling" the transistor M2, i.e., set between the first terminal 102a (the one on which the current ibias2 passes, i.e., in the present case of a FET, the drain) and the control terminal (in the present case of a FET, the gate) of the transistor M2.

Going into greater detail in the illustration of the structure of the stages 101 and 102, it will be noted that, in one or more embodiments, the first stage 101 may comprise two branches in parallel between the terminals 101a, 101b, with each branch respectively comprising a first transistor M11, M21 and a second transistor M12, M22, for example, FETs. In one or more embodiments, the first transistor of each branch, i.e., the transistor M11 or the transistor M21, is set between the first terminal 101a and the second transistor M12, M22.

In one or more embodiments, the transistors of each branch, i.e., M11, M12 and, respectively M21, M22 are set with the respective current paths (i.e., the source-to-drain path, in the case of a FET) in series with respect to one another between the first and second terminals 101a, 101b.

In other words, in one or more embodiments, the two current branches in parallel of the first stage 101 have a first common terminal 101a for the bias current ibias1 and a second terminal 101b, which is also common, that can be connected to ground GND according to the criteria illustrated more fully in what follows.

In one or more embodiments, the control terminals (gate, in the case of a FET) of the transistors M12 and M22 are coupled (short-circuited) to one another.

In one or more embodiments, the transistor M22 has its control terminal (gate, in the case of a FET) short-circuited to the current path, for example in a point set between the transistor M21 and the transistor M22 (for instance, to the drain of the two transistors M21, M22 in the example considered herein).

Once again, in one or more embodiments, the two stages 101, 102 can be coupled together through the coupling line 103 that extends between the intermediate point between the transistors M11, M12 and the intermediate point between the control terminal (for example, the gate in the case of a FET) of the transistor M2 and the Miller compensation network 104.

In one or more embodiments, the second (common) terminal 101b of the two branches of the first stage 101 can be coupled to ground GND via a compensation-control transistor M1 (e.g., a FET) connected with its current path (source-to-drain path in the case of a FET) that is set between the second common terminal 101b and ground GND, also connected to which is the second terminal 102b of the second stage 102.

The control terminal (gate in the case of a FET) of the transistor M1 is connected to the coupling line 103, i.e., in the example illustrated herein, to the intermediate point between the transistors M11 and M12.

In this way, the signal internal_n_as present on the line 103 that couples the stages 101 and 102 is "sensed" by the control electrode (e.g., gate) of the transistor M1 that can thus be said to be driven by the signal internal_n_as present on the coupling line 103.

In one or more embodiments, the transistor M1 prevents complete discharge of the capacitance C of the Miller compensation network blocking the level of the signal internal_n_as present on the coupling line 103 to a voltage value close to Vt (for example, the gate-to-source voltage of the transistor M1) above the level of ground GND.

This situation may arise when the differential pair at input (in particular, the transistors M11, M21 that receive on the respective control terminals the input voltages Vin1, Vin2 on the OTA 120) is unbalanced.

In one or more embodiments, the circuit of FIG. 3 can admit substantially three operating states.

A first operating state can be seen to correspond to a condition in which the two voltages Vin1 and Vin2 are the same as one another (i.e., Vin1=Vin2), a condition that may correspond, in a scheme as appears from FIG. 2, to a condition in which the feedback voltage of the feedback network 124 (resistors $R_1$, $R_2$) is at the same level as the reference input voltage Vref.

In these conditions, the transistor M1 is in conditions of (high) conduction and substantially behaves as a resistor, without appreciably altering operation of the circuit.

In the presence of an unbalancing phenomenon, for example Vin1>Vin2, the differential input pairs of the stage 101 will be unbalanced in the sense, for example, of increasing the level of the signal internal_n_as present on the coupling line 103.

In this case, the transistor M1 will be in conditions of high conduction with a low (virtually zero) gate-to-source impedance.

In the presence of an unbalancing in the opposite direction at input, for example Vin1<Vin2, there will be an unbalancing situation such as to lower the level of the signal internal_n_as present on the coupling line 103.

In this case—as mentioned previously—the transistor M1 can intervene by stopping the reduction of the above voltage at a level, for example, equal to Vt with respect to the level of ground GND. In this way, thanks to the intervention of the transistor M1, the transistor M2 will in any case be (weakly) on, i.e., conductive, preventing (even markedly) nonlinear operating areas of the components involved.

In other words, intervention of the transistor M1 can be substantially equated with an intervention such as to "clamp" the voltage on the coupling line 103 when this would tend to go to an (excessively) low level.

One or more embodiments may consequently regard a circuit including:
  a first stage (e.g., 101) and a second stage (e.g., 102), with a respective first terminal (e.g., 101a) for a respective bias current (e.g., ibias1) and a respective second terminal (e.g., 101b) that can be coupled to ground (GND), wherein said first stage includes a differential stage coupled via a coupling line (e.g., 103) to said second stage,
  wherein said second stage includes a transistor (e.g., M2) with a Miller compensation network (e.g., 104), which is set between the first terminal of the second stage and the control terminal of said transistor (e.g., M2); and
    a compensation-control transistor (e.g., M1), which is coupled to the second terminal of said first stage and can be activated for coupling to ground said second terminal of said first stage, said compensation-control transistor having a control terminal (e.g., the gate in the case of a FET), which is coupled to said coupling line between said first stage and said second stage.

In one or more embodiments, said first stage may include a differential input stage with two branches in parallel (e.g., M11, M12; M21, M22 in FIG. 3) between a first common terminal (e.g., 101a) of said first stage for a (first) bias current (e.g., ibias1) and a second common terminal (e.g., 101b) of said first stage that can be coupled to ground via said compensation-control transistor.

In one or more embodiments, said branches in parallel may include first transistors (e.g., M11, M21) and second transistors (e.g., M12, M22) with their current paths (source-to-drain in the case of FETs) set in series between said first common terminal of said first stage and said second common terminal of said first stage with, the first transistor that is set between said first common terminal and the second transistor and has a control terminal for receiving a input signal (e.g., Vin1, Vin2).

In one or more embodiments, (see, for example, FIG. 3) said second stage may include said transistor with Miller compensation network, with said coupling line (103) that is coupled between said Miller compensation network and the control terminal of said transistor, said control terminal being coupled to said coupling line.

In one or more embodiments, said transistors include field-effect transistors, optionally MOS transistors. One or more embodiments may use, in all or in part, bipolar transistors.

One or more embodiments may regard a voltage regulator, including:
  a circuit (e.g., 120) according to one or more embodiments, with said second stage (102) that supplies a Miller-compensated output (e.g., out_as in FIG. 3);
  a gain stage (e.g., 122) driven by said Miller-compensated output; and
  a feedback path (e.g., 124; $R_1$, $R_2$) that couples said gain stage with the first stage of said Miller compensation circuit.

In one or more embodiments, such a voltage regulator may include a level-shifter stage (e.g., 200), which is set between said Miller compensation circuit and said gain stage.

In one or more embodiments, said gain stage may include a high-gain transistor (e.g., 122).

In one or more embodiments, said level-shifter stage may include a further high-gain transistor (e.g., 206), which is coupled in a current-mirror configuration to said high-gain transistor of said gain stage.

One or more embodiments may regard a voltage-regulator circuit (e.g., 10 in FIG. 1) including a cascaded arrangement of a plurality of voltage regulators (e.g., 12, 14, 16) with at least one (e.g., 12) of said voltage regulators that includes a voltage regulator according to one or more embodiments.

One or more embodiments may regard a method for operation of a circuit including:
  a first stage and a second stage, with a respective first terminal for a respective bias current and a respective second terminal that can be coupled to ground, wherein said first stage includes a differential stage coupled, via a coupling line, to the second stage,
  wherein said second stage includes a transistor with a Miller compensation network set between the first terminal of the second stage and the control terminal of said transistor, the method possibly including:
coupling to the second terminal of said first stage a compensation-control transistor that can be activated for coupling said second terminal to ground; and
coupling to ground said second terminal of said first stage by driving the control terminal of said compensation-control transistor via (e.g., signal internal-_n_as) said coupling line.

Without prejudice to the underlying principles, the details of construction and the embodiments may vary, even significantly, with respect to what has been illustrated herein purely by way of non-limiting example, without thereby departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
a first stage including a first terminal configured to receive a first bias current and a second terminal coupleable to a ground, wherein said first stage includes a differential stage electrically connected between the first and second terminals of the first stage;
a second stage that includes a first terminal configured to receive a second bias current, a second terminal electrically coupled to the ground, a first transistor with a control terminal, and a Miller compensation network coupled between the first terminal of the second stage and the control terminal of said first transistor;
a coupling line that electrically couples the differential stage to the second stage; and
a second transistor coupled to the second terminal of said first stage and configured to provide a current path from the differential stage and said second terminal of said first stage to the ground, said second transistor having a control terminal electrically coupled to said coupling line between said first stage and said second stage.

2. The circuit of claim 1, wherein:
the differential stage of said first stage includes a differential input stage with first and second branches arranged in parallel between the first terminal of said first stage and the second terminal of said first stage.

3. The circuit of claim 2, wherein:
said first branch includes third and fourth transistors having respective current paths in series between said first terminal of said first stage and said second terminal of said first stage, the third transistor being set between said first terminal of said first stage and the fourth transistor and having a control terminal configured to receive a first input signal; and
said second branch includes s-fifth and sixth transistors having respective current paths in series between said first terminal of said first stage and said second terminal of said first stage, the fifth transistor being set between said first terminal of said first stage and the sixth transistor and having a control terminal configured to receive a second input signal.

4. The circuit of claim 1, wherein said coupling line is coupled to the second stage between said Miller compensation network and the control terminal of said first transistor, said control terminal being coupled with said coupling line.

5. The circuit of claim 1, wherein said first and second transistors include field effect transistors.

6. A voltage regulator, comprising:
an amplifier circuit configured to provide a Miller-compensated output, the amplifier circuit including:
a first stage including a first terminal configured to receive a first bias current and a second terminal coupleable to a ground, wherein said first stage includes a differential stage electrically connected between the first and second terminals of the first stage;
a second stage that includes a first terminal configured to receive a second bias current, a second terminal electrically coupled to the ground, a first transistor with a control terminal, and a Miller compensation network coupled between the first terminal of the second stage and the control terminal of said first transistor;
a coupling line that electrically couples the differential stage to the second stage; and
a second transistor coupled to the second terminal of said first stage and configured to provide a current path from the differential stage and said second terminal of said first stage to the ground, said second transistor having a control terminal electrically coupled to said coupling line between said first stage and said second stage;
a gain stage configured to be driven by said amplifier circuit; and
a feedback path coupling said gain stage with the first stage of said amplifier circuit.

7. The voltage regulator of claim 6, including a level transfer stage between said amplifier circuit and said gain stage.

8. The voltage regulator of claim 7, wherein:
said gain stage includes a first high gain transistor; and
the level transfer stage includes a second high gain transistor coupled in a current mirror arrangement with said first high gain transistor.

9. The voltage regulator of claim 6, wherein:
the differential stage of said first stage includes a differential input stage with first and second branches arranged in parallel between the first terminal of said first stage and the second terminal of said first stage.

10. The voltage regulator of claim 9, wherein:
said first branch includes third and fourth transistors having respective current paths in series between said first terminal of said first stage and said second terminal of said first stage, the third transistor being set between said first terminal of said first stage and the fourth transistor and having a control terminal configured to receive a first input signal; and
said second branch includes fifth and sixth transistors having respective current paths in series between said first terminal of said first stage and said second terminal of said first stage, the fifth transistor being set between said first terminal of said first stage and the sixth transistor and having a control terminal configured to receive a second input signal.

11. The voltage regulator of claim 6, wherein said coupling line is coupled to the second stage between said Miller compensation network and the control terminal of said first transistor, said control terminal being coupled with said coupling line.

12. A voltage regulator system, comprising:
a cascaded arrangement of a plurality of voltage regulators with at least one of said voltage regulators including:
an amplifier circuit configured to provide a Miller-compensated output, the amplifier circuit including:
a first stage including a first terminal configured to receive a first bias current and a second terminal coupleable to a ground, wherein said first stage includes a differential stage electrically connected between the first and second terminals of the first stage;
a second stage that includes a first terminal configured to receive a second bias current, a second terminal electrically coupled to the ground, a first transistor with a control terminal, and a Miller compensation network coupled between the first terminal of the second stage and the control terminal of said first transistor;
a coupling line that electrically couples the differential stage to the second stage; and
a second transistor coupled to the second terminal of said first stage and configured to provide a current path from the differential stage and said second terminal of said first stage to the ground, said second transistor having a control terminal electrically coupled to said coupling line between said first stage and said second stage;
a gain stage configured to be driven by said amplifier circuit; and
a feedback path coupling said gain stage with the first stage of said amplifier circuit.

13. The voltage regulator system of claim 12, wherein the at least one of said voltage regulators includes a level transfer stage between said amplifier circuit and said gain stage.

14. The voltage regulator system of claim 13, wherein:
said gain stage includes a first high gain transistor; and
the level transfer stage includes a second high gain transistor coupled in a current mirror arrangement with said first high gain transistor.

15. The voltage regulator system of claim 12, wherein:
the differential stage of said first stage includes a differential input stage with first and second branches arranged in parallel between the first terminal of said first stage and the second terminal of said first stage.

16. The voltage regulator system of claim 15, wherein:
said first branch includes third and fourth transistors having respective current paths in series between said first terminal of said first stage and said second terminal of said first stage, the third transistor being set between said first terminal of said first stage and the fourth transistor and having a control terminal configured to receive a first input signal; and
said second branch includes fifth and sixth transistors having respective current paths in series between said first terminal of said first stage and said second terminal of said first stage, the fifth transistor being set between said first terminal of said first stage and the sixth transistor and having a control terminal configured to receive a second input signal.

17. The voltage regulator system of claim 12, wherein said coupling line is coupled to the second stage between said Miller compensation network and the control terminal of said first transistor, said control terminal being coupled with said coupling line.

18. A circuit, comprising:
a first stage that includes:
a first terminal configured to receive a first bias current;
a ground terminal;
a first intermediate node;
a differential stage including first and second branches coupled in parallel between the first terminal and the intermediate node, the first branch including first and second transistors coupled in series between the first terminal and the intermediate node, and the second branch including third and fourth transistors coupled in series between the first terminal and the intermediate node and coupled to each other by a second intermediate node; and
a fifth transistor coupled between the first intermediate node and the ground terminal and having a control terminal coupled to the second intermediate node, the fifth transistor being configured to provide a current path from the first intermediate node to the ground terminal based on a voltage at the second intermediate node.

19. The circuit of claim 18, further comprising:
a second stage that includes a first terminal configured to receive a second bias current, a second terminal coupled to the ground terminal, a first transistor with a control terminal, and a Miller compensation network coupled between the first terminal of the second stage and the control terminal of said first transistor.

20. The circuit of claim 19, further comprising:
a coupling line that couples the second intermediate node to the second stage; wherein said coupling line is coupled to the second stage between said Miller compensation network and the control terminal of said first transistor.

* * * * *